United States Patent
Jo et al.

(10) Patent No.: US 7,952,199 B2
(45) Date of Patent: *May 31, 2011

(54) CIRCUIT BOARD INCLUDING SOLDER BALL LAND HAVING HOLE AND SEMICONDUCTOR PACKAGE HAVING THE CIRCUIT BOARD

(75) Inventors: Sang-Gui Jo, Choongcheongnam-do (KR); Seung-Kon Mok, Chungcheongnam-do (KR); Han-Shin Youn, Chungcheongnam-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/684,476

(22) Filed: Jan. 8, 2010

(65) Prior Publication Data

US 2010/0116539 A1    May 13, 2010

(51) Int. Cl.
*H01L 23/488* (2006.01)
(52) U.S. Cl. . 257/738; 257/737; 257/774; 257/E23.021; 257/E23.067; 257/E23.069; 174/262; 174/263; 174/267
(58) Field of Classification Search ........... 174/267, 174/261–263; 257/737, 738, 779, 780, 774, 257/E23.02, E23.021, E23.067, E23.069
See application file for complete search history.

(56) References Cited

U.S. PATENT DOCUMENTS

| | | | |
|---|---|---|---|
| 5,872,399 A | 2/1999 | Lee | |
| 6,084,781 A | 7/2000 | Klein | |
| 6,455,408 B1 | 9/2002 | Hwang et al. | |
| 2004/0004293 A1* | 1/2004 | Murayama | 257/780 |
| 2005/0116340 A1 | 6/2005 | Shindo | |
| 2006/0157865 A1 | 7/2006 | Hokari | |

FOREIGN PATENT DOCUMENTS

| | | |
|---|---|---|
| JP | 07022538 A | 1/1995 |
| JP | 10303330 | 11/1998 |
| KR | 1020040083192 | 10/2004 |

* cited by examiner

*Primary Examiner* — Jerome Jackson, Jr.
*Assistant Examiner* — Yu Chen
(74) *Attorney, Agent, or Firm* — Muir Patent Consulting, PLLC

(57) ABSTRACT

A circuit board and a semiconductor package having the same are provided. The circuit board comprises a base substrate having interconnections, and solder ball lands disposed on one surface of the base substrate. The solder ball lands respectively have land holes having different sizes. The land hole disposed at the center portion of the base substrate and the land hole disposed at the edge portion of the base substrate may have different sizes. For example, the sizes of the land holes may increase from the center portion of the base substrate to the edge portion thereof, and alternatively, the sizes of the land holes may decrease from the center portion of the base substrate to the edge portion thereof.

7 Claims, 10 Drawing Sheets

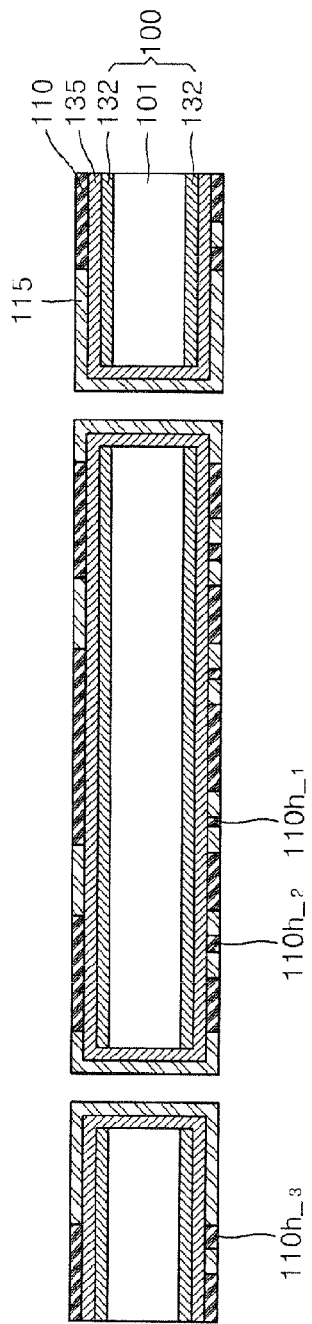
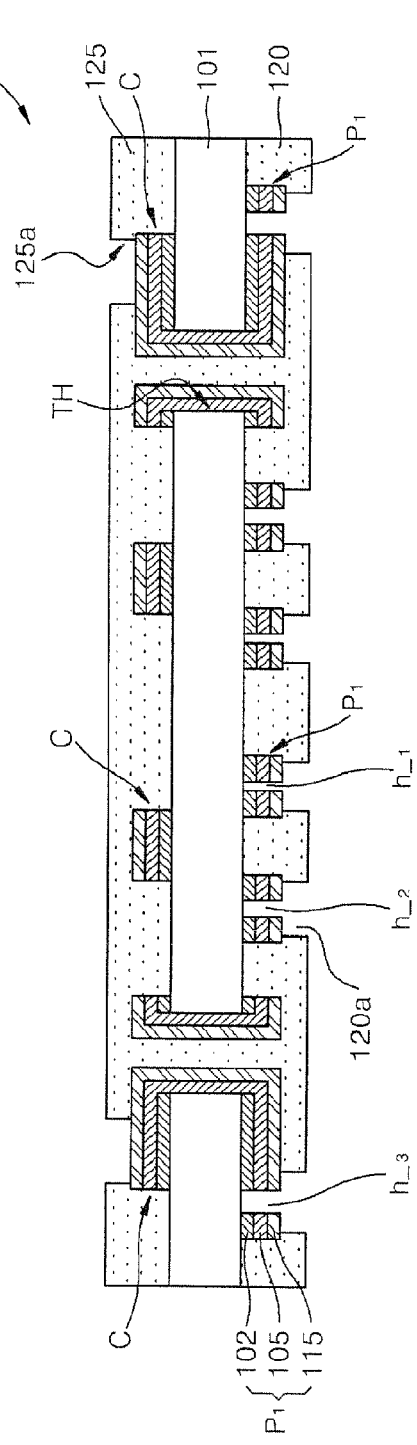
FIG. 7C
FIG. 7D

CIRCUIT BOARD INCLUDING SOLDER BALL LAND HAVING HOLE AND SEMICONDUCTOR PACKAGE HAVING THE CIRCUIT BOARD

CROSS-REFERENCE TO RELATED PATENT APPLICATION

This application claims the benefit of priority under 35 U.S.C. §120 to U.S. patent application Ser. No. 11/745,342 filed on May 7, 2007, now U.S. Pat No. 7,667,325 the disclosure of which is incorporated herein by reference in its entirety, and which claims the benefit of priority under 35 U.S.C. §119 to Korean Patent Application No. 10-2006-0041969, filed on May 10, 2006, in the Korean Intellectual Property Office, the disclosure of which is incorporated herein in its entirety by reference.

BACKGROUND

1. Technical Field

The present invention relates to a circuit board and a semiconductor package having the circuit board, and more particularly, to a circuit board including a solder ball land having a hole and a semiconductor package having the circuit board.

2. Description of the Related Art

Due to constant demand for ever smaller electronic devices, there is a corresponding demand for miniaturization of semiconductor products to go in the electronic devices. With miniaturization of semiconductor products further accelerated, a flat, light-weight, and simple structure of a semiconductor package has been further required along with the high integration of a semiconductor chip itself. To meet such demands, solder ball packages using a solder ball as a mounting means for a package, for example, a ball grid array (BGA) package, are being actively developed.

In the BGA package, contact reliability of the solder ball may be deteriorated due to fatigue or package warpage caused by temperature changes during manufacturing and operation. Korean Patent Publication No. 2004-0083192 discloses a solder ball package. The solder ball package has improved reliability by forming an anchor-shaped hole pattern in a ball land to increase the contact area between the solder ball and the ball land and prevent cracking of the solder ball.

The solder ball package can improve the contact reliability between the solder ball and the ball land, but does not have any means to solve mounting failures due to height differences of the solder balls caused by warpage of the package when mounting the package to a product. Consequently, a need remains for a solder ball package with improved contact reliability and the ability to prevent mounting failures due to warpage of the package.

SUMMARY

This disclosure provides a circuit board capable of improving the contact reliability between a package and a circuit substrate upon which the package is mounted, and a semiconductor package having the circuit board. This disclosure also provides methods of fabricating a circuit board with improved contact reliability.

BRIEF DESCRIPTION OF THE DRAWINGS

The above and other features and advantages of the present invention will become more apparent by describing in detail exemplary embodiments thereof with reference to the attached drawings in which:

FIGS. 7A through 7D are sectional views illustrating a method of fabricating a circuit board according to a fourth embodiment of the present invention.

DETAILED DESCRIPTION

Figure 1:
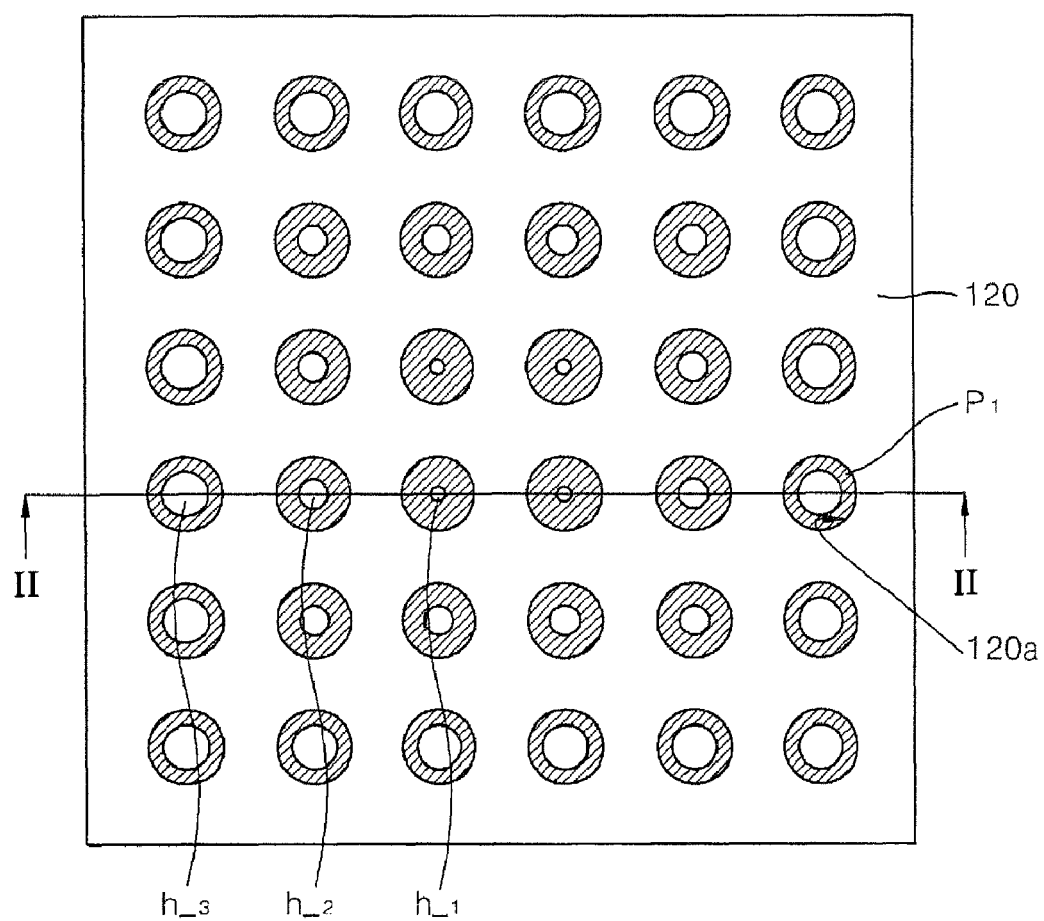
FIG. 1 is a plan view illustrating a rear side of a circuit board according to a first embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

First Embodiment

Figure 2:
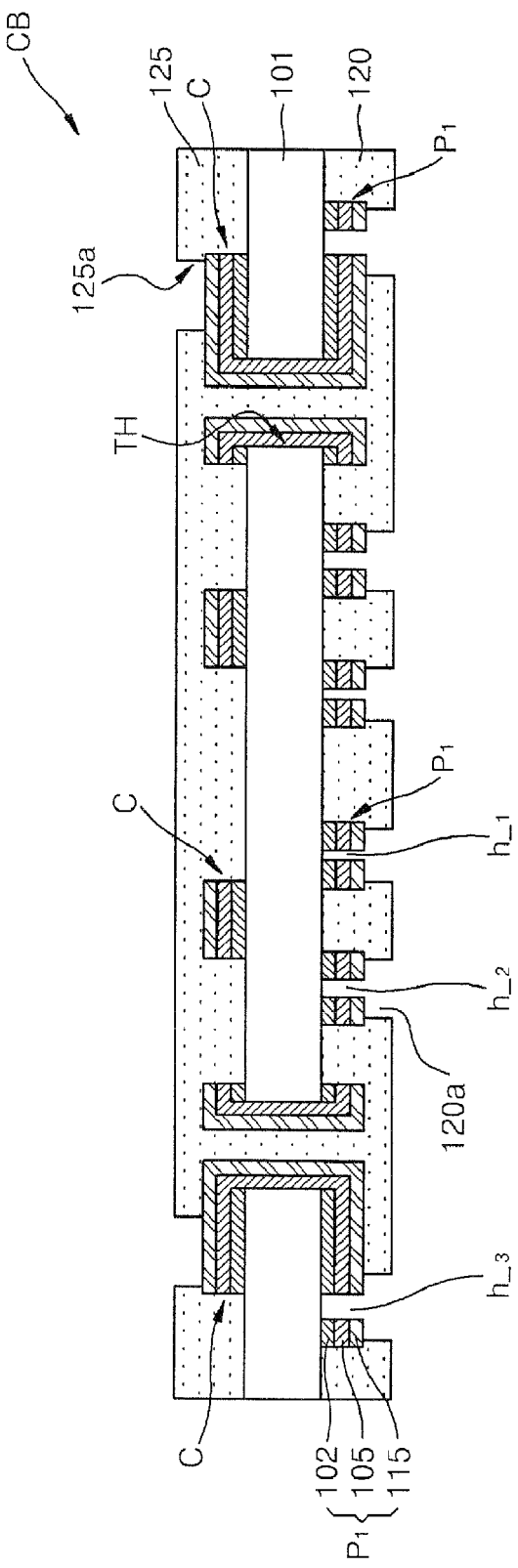
FIG. 2 is a sectional view taken along a line II-II of FIG. 1, which illustrates a circuit board according to the first embodiment of the present invention.

FIG. 1 is a plan view illustrating a rear side of a circuit board according to a first embodiment of the present invention, and FIG. 2 is a sectional view taken along line II-II of FIG. 1, which illustrates a circuit board according to the first embodiment of the present invention.

Referring to FIGS. 1 and 2, a circuit board CB includes a base substrate 101 having interconnections C on at least one surface. A plurality of solder ball lands P1, which are electrically connected to the interconnections C, are disposed on the other surface of the base substrate 101. The base substrate 101 has through holes TH penetrating therethrough, and the interconnections C and the solder ball lands P1 can be electrically connected through the through holes TH.

The solder ball lands $P_1$ respectively have land holes $h\_1$, $h\_2$, $h\_3$. The land holes $h\_1$, $h\_3$ have different sizes with respect to each other. Specifically, the size of the land hole $h\_1$ may be different from the size of the land hole $h\_2$, the size of the land hole $h\_2$ may be different from the size of the land hole $h\_3$, and so on. Thus, the land hole $h\_1$ disposed at the center portion of the base substrate 101, and the land hole $h\_3$ disposed at the edge portion of the base substrate 101 may have different sizes with respect to each other. In one example, as shown in the drawings, the sizes of the land holes $h\_1$, $h\_2$, $h\_3$ increase from the center portion of the base substrate 101 to the edge portion thereof. Further, the land holes $h\_1$, $h\_2$, $h\_3$ have circular shapes in the drawing, but they are not limited to being circular, and may have other shapes such as a triangular shape, a rectangular shape, a hexagonal shape and the like. When the land holes $h\_1$, $h\_2$, $h\_3$ are substantially circular, the diameters of the circular land holes $h\_1$, $h\_2$, $h\_3$ may be different with respect to each other.

Each of the solder ball lands P1 and the interconnections C may respectively have a first conductive layer pattern 102, a second conductive layer pattern 105, and a third conductive layer pattern 115, which are sequentially stacked on the base substrate 101. The through holes TH may have the second conductive layer pattern 105 and the third conductive layer pattern 115 disposed on the sidewalls thereof.

A first mask 120 is disposed on the base substrate 101 and the solder ball lands $P_1$. The first mask 120 has openings 120a respectively exposing portions of the solder ball lands $P_1$. The land holes $h\_1$, $h\_2$, $h\_3$ may be exposed inside the openings 120a. Further, the land holes $h\_1$, $h\_2$, $h\_3$ are preferably exposed at the center portions of the openings 120a. The sizes of the openings 120a may be substantially the same with respect to each other, even though the land holes $h\_1$, $h\_2$, $h\_3$ exposed by the openings 120a have different sizes.

A second mask 125 is disposed on the interconnections C. The second mask 125 may have openings 125a exposing portions of the interconnections C.

Figure 3:
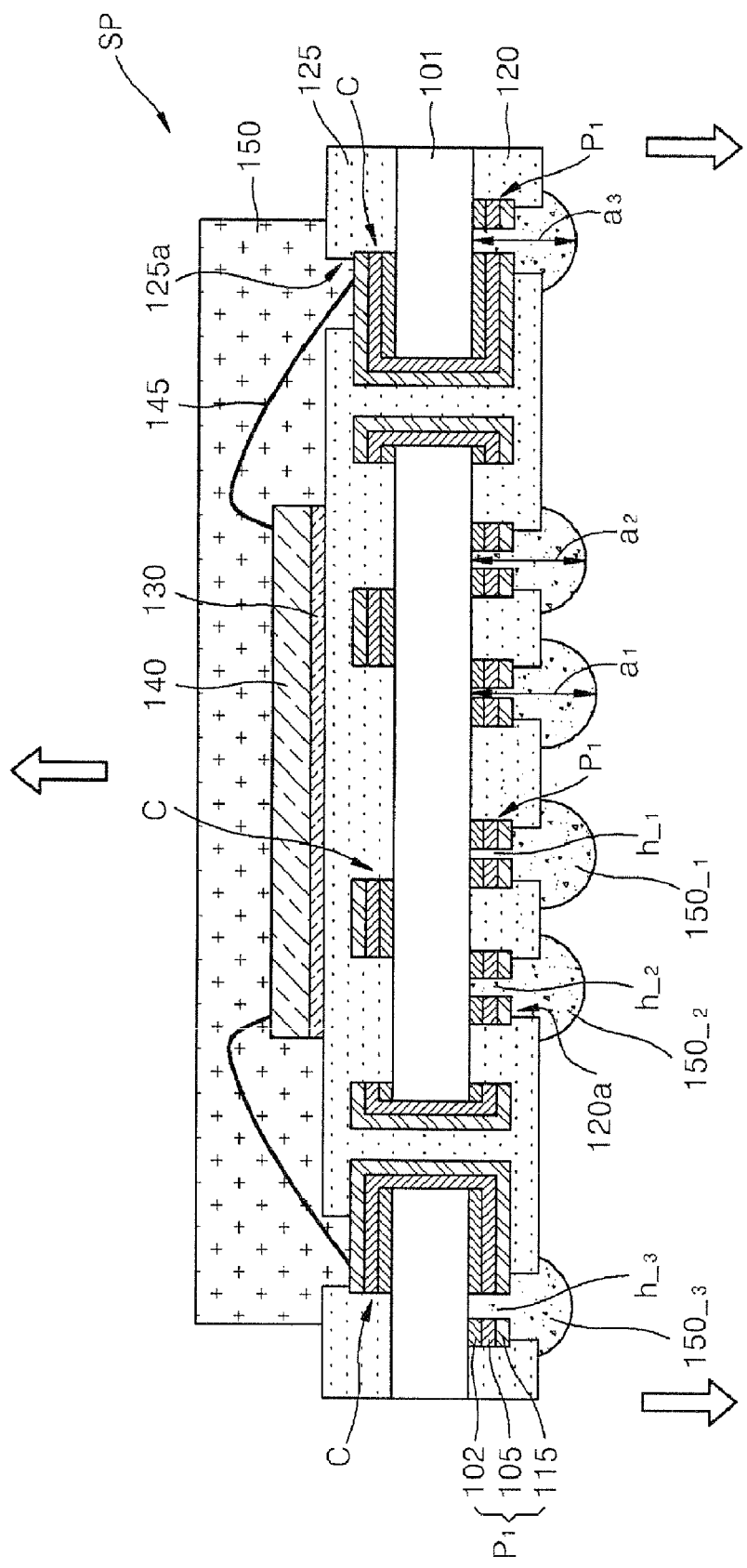
FIG. 3 is a sectional view illustrating a semiconductor package having the circuit board of FIG. 2.

FIG. 3 is a sectional view illustrating a semiconductor package having the circuit board of FIG. 2.

Referring to FIG. 3, an adhesive layer 130 is disposed on a portion of the second mask 125 of the circuit board CB explained above with reference to FIG. 2, and a semiconductor chip 140 is mounted onto the circuit board CB by the adhesive layer 130. An electrode pad (not shown) of the semiconductor chip 140 is electrically connected to the exposed interconnection C inside the opening 125a of the second mask 125 by a conductive wire 145. The semiconductor chip 140 and the conductive wire 145 are covered by a molding 150. The molding 150 functions to protect the semiconductor chip 140 and the conductive wire 145 from external physical impacts or moisture, and may include an epoxy resin. For example, the molding 150 may comprise an epoxy molding compound (EMC).

Solder balls $150\_1$, $150\_2$, $150\_3$ are disposed on the solder ball lands $P_1$ exposed on the bottom of the circuit board CB. The solder balls $150\_1$, $150\_2$, $150\_3$ are disposed on the solder ball lands $P_1$ and then attached to the solder ball lands $P_1$ using a reflow process. Thus, a semiconductor package SP is fabricated.

When the solder balls $150\_1$, $150\_2$, $150\_3$ are disposed on the solder ball lands $P_1$, the solder balls $150\_1$, $150\_2$, $150\_3$ and the solder ball lands $P_1$ can be more easily aligned due to the land holes $h\_1$, $h\_2$, $h\_3$. In other words, the land holes $h\_1$, $h\_2$, $h\_3$ help align the solder $150\_1$, $150\_2$, $150\_3$ balls to the ball land pads $P_1$. Further, when the land holes $h\_1$, $h\_2$, $h\_3$ are exposed at the center portions of the openings 120a, the solder balls $150\_1$, $150\_2$, $150\_3$ can be well aligned to the center portions of the openings 120a. In particular, when the solder balls $150\_1$, $150\_2$, $150\_3$ are smaller in size than the openings 120a, the alignment may be further improved by the land holes $h\_1$, $h\_2$, $h\_3$.

Further, the solder balls $150\_1$, $150\_2$, $150\_3$ partially flow into the land holes $h\_2$, $h\_3$ during the reflow process. Specifically, during reflow, a portion of the solder balls $150\_1$, $150\_2$, $150\_3$ flows into the land holes $h\_1$, $h\_2$, $h\_3$, thereby increasing the contact area between the solder balls $150\_1$, $150\_2$, $150\_3$ and the solder ball lands $P_1$. Thus, as contact areas between the solder balls $150\_1$, $150\_2$, $150\_3$ and the solder ball lands $P_1$ increase, the solder balls $150\_1$, $150\_2$, $150\_3$ can be more reliably connected to the solder ball lands $P_1$.

As explained above with reference to FIG. 2, the land holes $h\_1$, $h\_2$, $h\_3$ have different sizes with respect to each other. Thus, after the reflow process, the heights $a_1$, $a_2$, $a_3$ of the solder balls $150\_1$, $150\_2$, $150\_3$ may be different. In particular, when the size of the land hole is larger, the height of the solder ball is lower. This is the case because the solder balls $150\_1$, $150\_2$, $150\_3$ all have substantially the same volume. In other words, prior to reflow, the solder balls $150\_1$, $150\_2$, $150\_3$ may all have substantially the same size and shape. Since the thermal expansion coefficients of the base substrate 101, the semiconductor chip 140, and the molding 150 are different, warping of the semiconductor package SP may occur. The direction of warping or shape of the semiconductor package may change depending on the materials of the base substrate 101, the semiconductor chip 140, and the molding 150. However, according to an embodiment of the invention, even if the semiconductor package SP is warped, the end portions of the solder balls $150\_1$, $150\_2$, $150\_3$ may be disposed on the same plane surface by calculating the direction of warping of the semiconductor package SP in accordance with the materials of the base substrate 101, the semiconductor chip 140, and the molding 150, and forming the land holes $h\_1$, $h\_2$, $h\_3$ to have different sizes based on the calculated direction. As a result, even if warping occurs in the semiconductor package SP, component elements can be reliably mounted on a mounting substrate because each of the solder balls $150\_1$, $150\_2$, $150\_3$ will be in substantially the same level plane. Thus, connection failures between the semiconductor package SP and a mounting substrate can be effectively prevented.

Generally, when the edge portions of the semiconductor package SP are warped up or down compared to the center portion thereof, the land hole $h\_1$ disposed at the center portion of the base substrate 101, and the land hole $h\_3$ disposed at the edge portion of the base substrate 101 ma be formed to have different sizes with respect to each other. When the edge portions of the semiconductor package SP are warped down compared to the center portion thereof, as shown by the arrows in FIG. 3, the sizes of the land holes $h\_1$, $h\_2$, $h\_3$ are preferably increased from the center portion of the base substrate 101 to the edge portion thereof. Therefore, the warpage of the semiconductor package SP can be compensated by decreasing the heights $a_1$, $a_2$, $a_3$ of the solder balls $150\_1$, $150\_2$, $150\_3$ from the center portion of the base substrate 101 to the edge portion thereof. Thus, even if warpage occurs, the solder balls $150\_1$, $150\_2$, $150\_3$ will be in substantially the same level plane.

Furthermore, in a package on package (POP) type package, the alignment and the mounting reliability can be improved when the upper package is mounted on a lower package by forming the upper package to have a structure as described above. Further, the lower package may also be formed to have a structure as described above. Thus, according to an aspect of the invention, even though the upper and lower packages may experience warpage, good electrical connections can still be made between the packages due to the different heights of the solder balls electrically connecting the packages.

Second Embodiment

Figure 4:
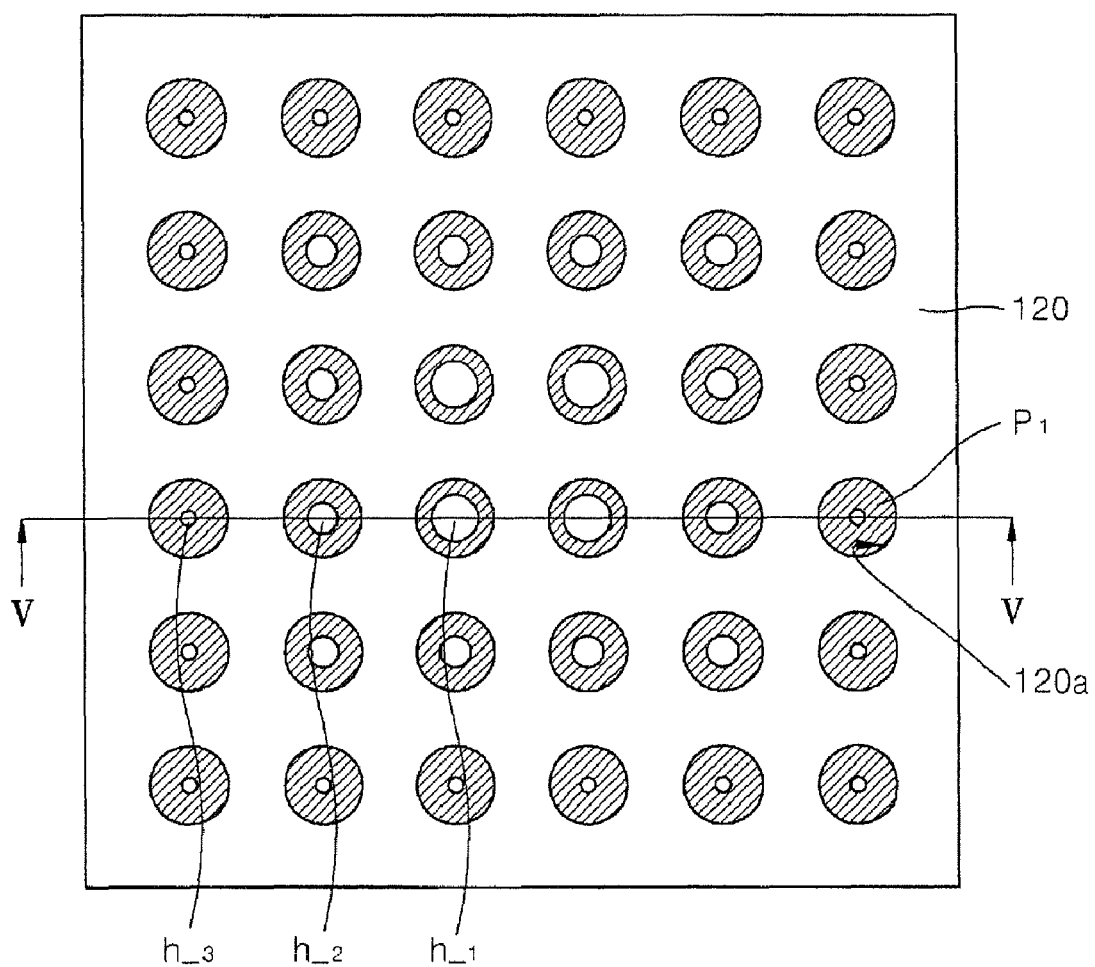
FIG. 4 is a plan view illustrating a rear side of a circuit board according to a second embodiment of the present invention.
Figure 5:
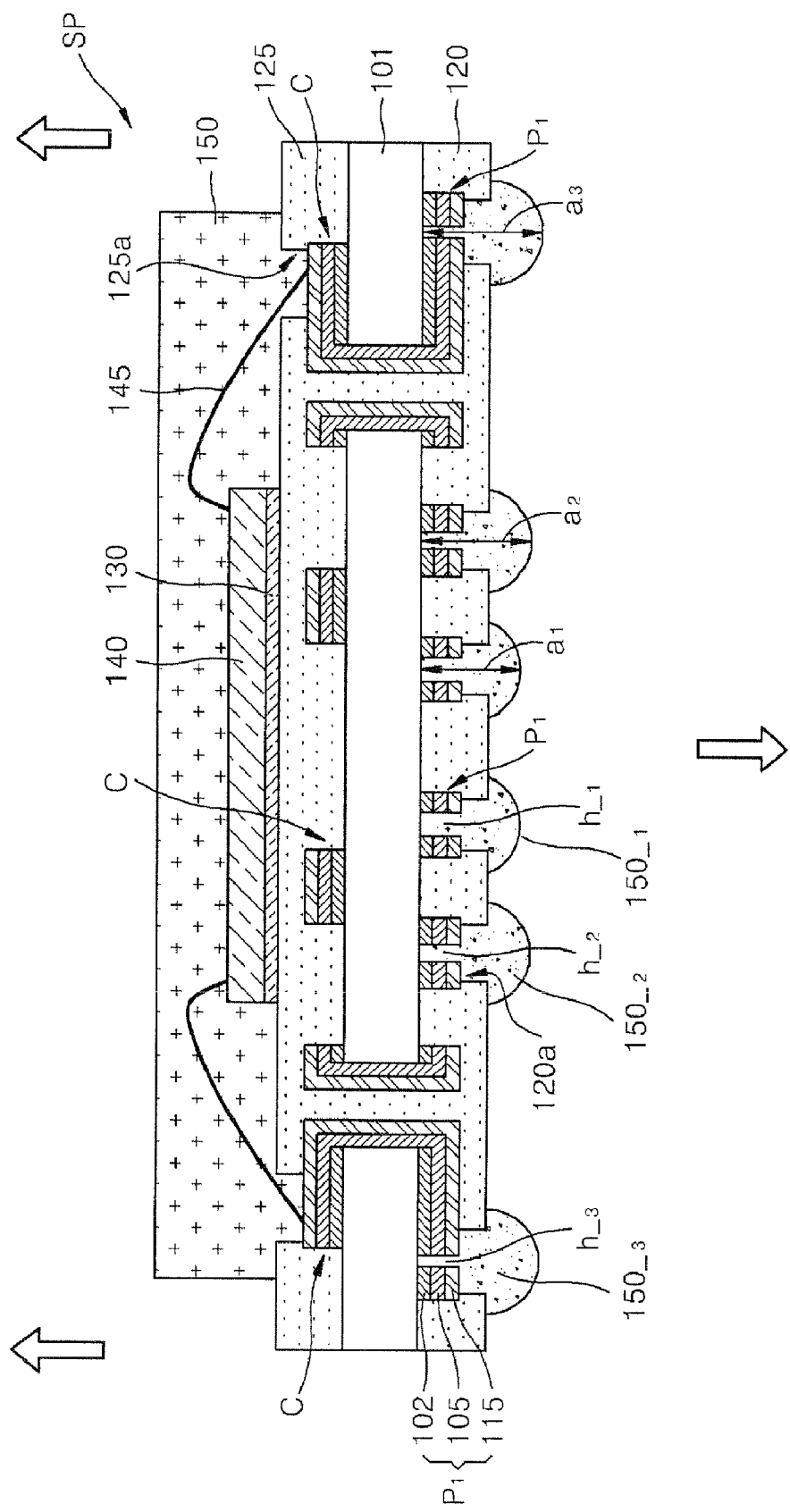
FIG. 5 is a sectional view taken along a line V-V of FIG. 4, which illustrates a semiconductor package having the circuit board of FIG. 4.

FIG. 4 is a pian view illustrating a rear side of a circuit board according to a second embodiment of the present invention, and FIG. 5 is a sectional view illustrating a semiconductor package having the circuit board of FIG. 4. The sectional view of FIG. 5 is taken along a line V-V of FIG. 4.

The circuit board and the semiconductor package according to this embodiment of the present invention are similar to the circuit board CB and the semiconductor package SP explained above with reference to FIGS. 1 through 3, except for the following points.

Referring to FIGS. 4 and 5, the sizes of the land holes h\_1, h\_2, h\_3 decrease from the center portion of the base substrate 101 to the edge portion thereof. Thus, the heights $a_1$, $a_2$, $a_3$ of the solder balls 150\_1, 150\_2, 150\_3 may be increased from the center portion of the base substrate 101 to the edge portion thereof.

As illustrated by the arrows in FIG. 5, when the edge portions of the semiconductor package SP are warped up compared to the center portion thereof, the warpage of the semiconductor package SP can be compensated by increasing the heights $a_1$, $a_2$, $a_3$ of the solder balls 150\_1, 150\_2, 150\_3 from the center portion of the base substrate 101 to the edge portion thereof. Thus, even if warpage occurs, the solder balls 150\_1, 150\_2, 150\_3 will be in substantially the same level plane.

Third Embodiment

Figure 6:
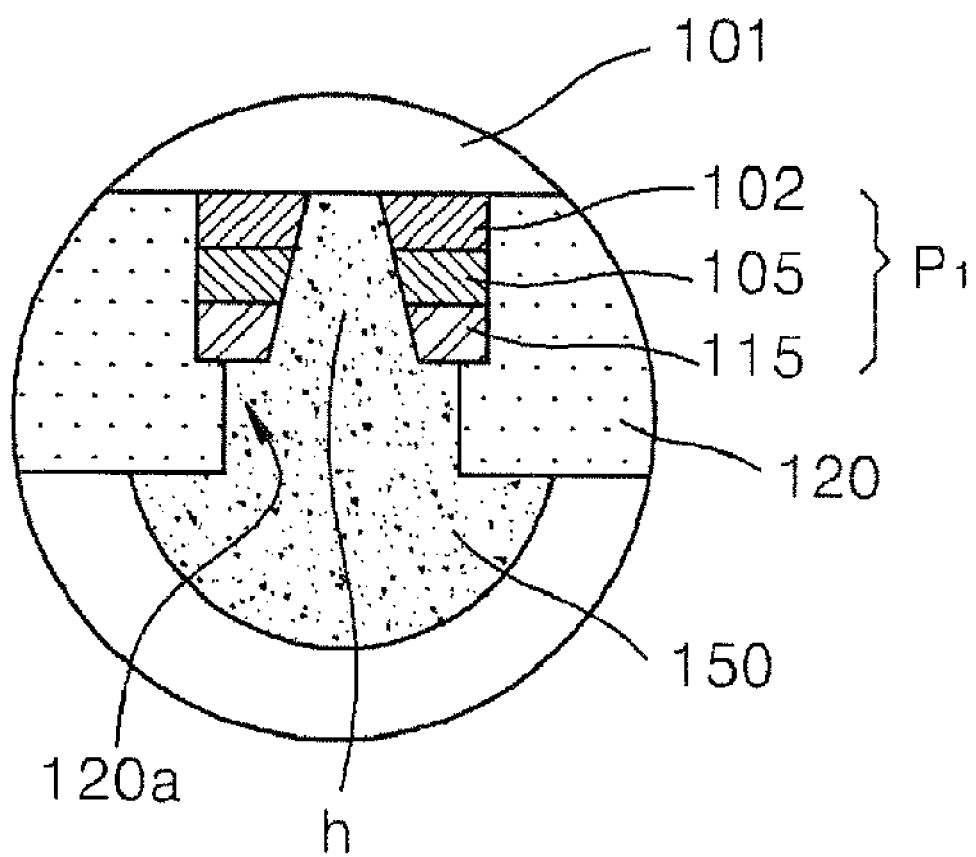
FIG. 6 is an enlarged sectional view illustrating a portion of a semiconductor package according to a third embodiment of the present invention.

FIG. 6 is an enlarged sectional view illustrating a portion of a semiconductor package according to a third embodiment of the present invention, and illustrates only a solder ball land. The semiconductor package according to this embodiment of the present invention is similar to the semiconductor package SP explained above with reference to FIG. 3 except for the following points.

Referring to FIG. 6, the diameter of the land hole h is increased from a bottom of the solder ball land $P_1$ (the portion closest to the base substrate 101) to a top surface of the solder ball land $P_1$. In other words, the sidewalls of the solder ball land $P_1$ may have a slope instead of being vertical. Thus, the contact area between the solder ball 150 and the solder ball land $P_1$ is increased. In this case, as the contact area between the solder ball land $P_1$ and the solder ball 150 increases, the solder ball 150 can be more reliably connected to the solder ball land $P_1$. Further, the sloped sidewalls of the solder ball land $P_1$ may help ensure that the solder ball 150 completely fills the land hole h during reflow, thereby creating a more reliable physical and electrical connection between the solder ball land $P_1$ and the solder ball 150.

Fourth Embodiment

FIGS. 7A through 7D are sectional views illustrating a method of fabricating a circuit board according to a fourth embodiment of the present invention.

Figure 7A:
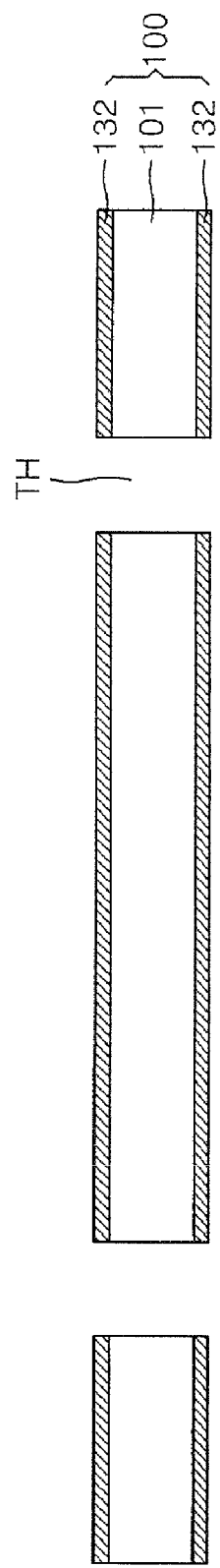

Referring to FIG. 7A, first plating layers 132 are stacked on both surfaces of a base substrate 101 so as to provide a plating layer stack substrate 100. The plating layer stack substrate 100 may be a copper clad laminate (CCL) having a copper layer as the first plating layer 132.

Through holes TH penetrating the plating layer stack substrate 100 are formed. Thus, the base substrate 101 has through holes TH penetrating therethrough.

Figure 7B:
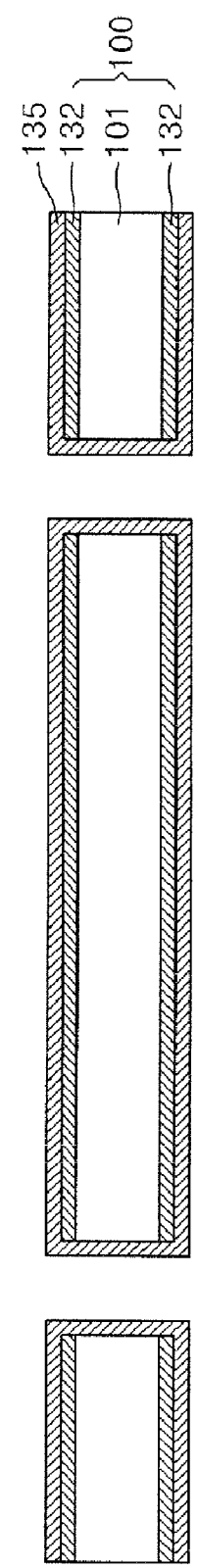

Referring to FIG. 7B, a second plating layer 135 is stacked on the upper surfaces of the first plating layers 132 and on the sidewalls of the through holes TH.

Referring to FIG. 7C, a photoresist film is stacked on the second plating layer 135, and the photoresist film is exposed and developed, thereby forming photoresist patterns 110 exposing portions of the second plating layer 135.

A third conductive layer pattern 115 is selectively formed on the second plating layer 135 exposed by the photoresist patterns 110. That is, the third conductive layer pattern 115 is formed at positions where the photoresist patterns 110 are not formed.

Referring to FIG. 7D, the photoresist patterns 110 (FIG. 7C) are removed, and using the third conductive layer pattern 115 as a mask, the second plating layer 135 and the first plating layer 132 are etched. As a result, interconnections C are formed on one surface of the base substrate 101, and a plurality of solder ball lands $P_1$ are formed on the other surface of the base substrate 101. Each of the solder ball lands $P_1$ and the interconnections C includes a first conductive layer pattern 102, a second conductive layer pattern 105, and a third conductive layer pattern 115, which are sequentially stacked on the base substrate 101, and the interconnections C and the solder ball lands $P_1$ may be electrically connected by the second conductive layer 105 and the third conductive layer 115 formed on the sidewalls of the through holes TH.

Further, the solder ball lands $P_1$ have land holes h\_1, h\_2, h\_3 having different sizes with respect to each other. The land holes h\_1, h\_2, h\_3 are formed to correspond to bar patterns 100h\_1, 100h\_2, 100h\_3 (FIG. 7C) disposed in the photoresist patterns 110 (FIG. 7C). Thus, in order to make the sizes of the land holes h\_1, h\_2, h\_3 different from each other, the sizes of bar patterns 100h\_1, 100h\_2, 100h\_3 need to be correspondingly different from each other. Also, according to some embodiments, the bar patterns 100h\_1, 100h\_2, 100h\_3 may have sloped sidewalls so that the resulting land holes h\_1, h\_2, h\_3 will have corresponding sloped sidewalls, as described above with respect to FIG. 6. Also, the second plating layer 135 and the first plating layer 132 may be etched in such a way that the resulting land holes h\_1, h\_2, h\_3 will have sloped sidewalls.

A first mask 120 is formed on the solder ball lands $P_1$, and a second mask 125 is formed on the interconnections C. Openings 120a are formed inside the first mask 120 so as to respectively expose portions of the solder ball lands $P_1$, and openings 125a are formed inside the second mask 125 so as to respectively expose portions of the interconnections C.

Thus, a circuit board is fabricated having solder ball lands $P_1$ and interconnections C on opposite sides of a base substrate 101. The solder ball lands $P_1$ and the interconnections C include a first conductive layer pattern 102, a second conductive layer pattern 105, and a third conductive layer pattern 115, which are sequentially stacked on the base substrate 101. The solder ball lands $P_1$ have land holes h\_1, h\_2, h\_3 having different sizes with respect to each other.

Fifth Embodiment

Figure 8A:
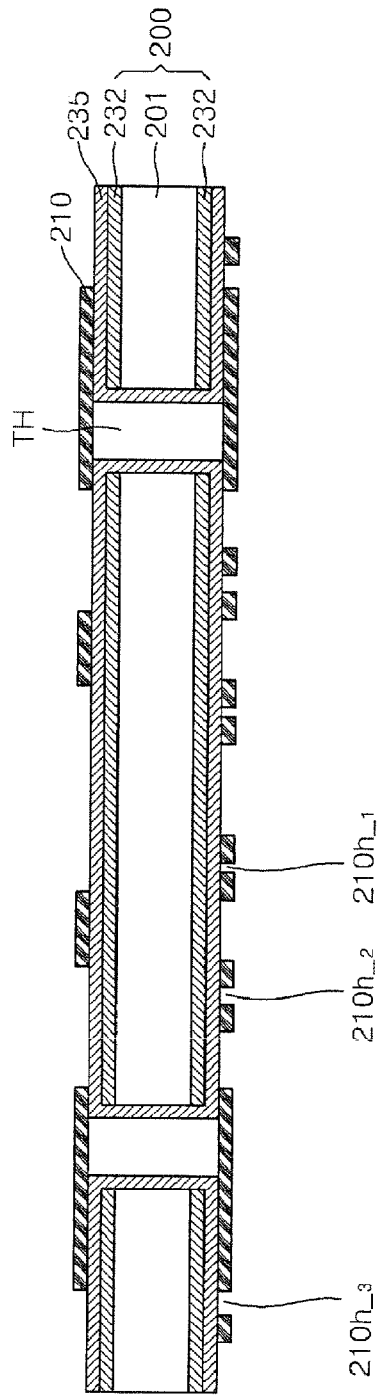
FIGS. 8A through 8C are sectional views illustrating a method of fabricating a circuit board according to a fifth embodiment of the present invention.
Figure 8B:
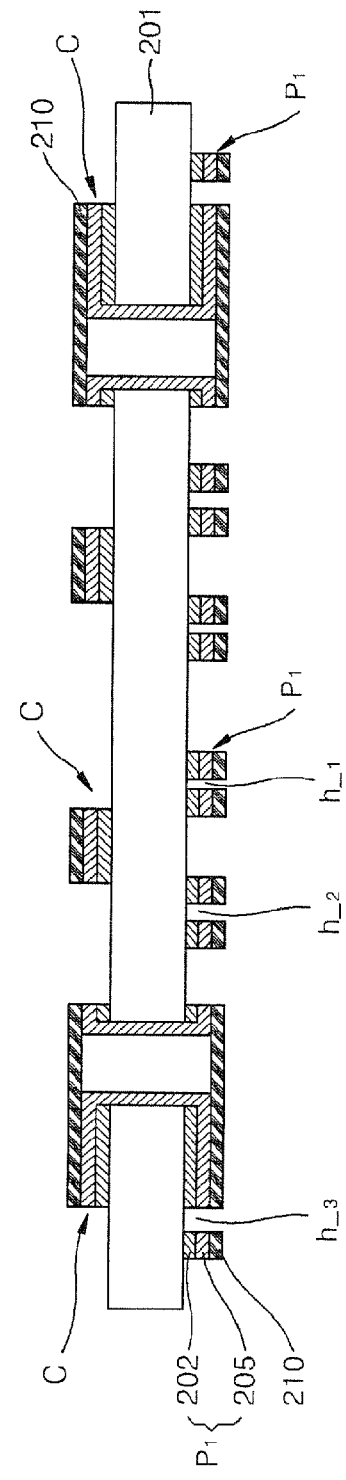
Figure 8C:
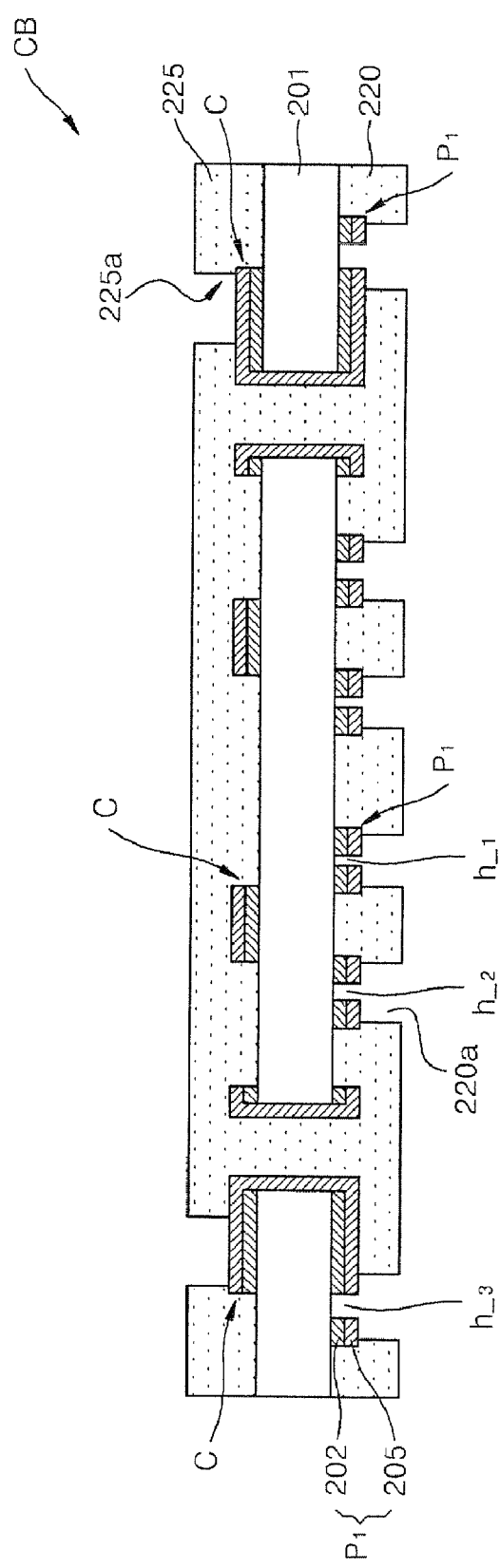

FIGS. 8A through 8C are sectional views illustrating a method of fabricating a circuit board according to a fifth embodiment of the present invention.

Referring to FIG. 8A, first plating layers 232 are stacked on both surfaces of a base substrate 201 so as to provide a plating layer stack substrate 200. The plating layer stack substrate 200 may be a copper clad laminate (CCL) having a copper layer as the first plating layer 232.

Through holes TH penetrating the plating layer stack substrate 200 are formed. Thus, the base substrate 201 has through holes TH penetrating therethrough. Then, a second plating layer 235 is stacked on the upper surfaces of the first plating layers 232 and on the sidewalls of the through holes TH.

Then, a photoresist film is stacked on the base substrate 201 having the second plating layer 235, and the photoresist film is exposed and developed, thereby forming photoresist patterns 210 exposing portions of the second plating layer 235.

Referring to FIG. 8B, the second plating layer 235 and the first plating layers 232 are etched using the photoresist patterns 210 as masks. As a result, interconnections C are formed on one surface of the base substrate 201 and a plurality of solder ball lands $P_1$ are formed on the other surface of the base substrate 201. Each of the solder ball lands $P_1$ and the interconnections C includes a first conductive layer pattern 202 and a second conductive layer pattern 205, which are sequentially stacked on the base substrate 201, and the interconnections C and the solder ball lands $P_1$ may be electrically connected by the second conductive layer pattern 205 formed on the sidewalls of the through holes TH.

Further, the solder ball lands $P_1$ have land holes $h\_1$, $h\_2$, $h\_3$ having different sizes with respect to each other. The land holes $h\_1$, $h\_2$, $h\_3$ are formed to correspond to hole patterns $210h\_1$, $210h\_2$, $210h\_3$ (FIG. 8A) disposed in the photoresist patterns 210 (FIG. 8A). Thus, in order to make the sizes of the land holes $h\_1$, $h\_2$, $h\_3$ different from each other, the sizes of the hole patterns $210h\_1$, $210h\_2$, $210h\_3$ (FIG. 8A) need to be correspondingly different from each other.

Referring to FIG. 8C, a first mask 220 is formed on the solder ball lands $P_1$ and a second mask 225 is formed on the interconnections C. Openings 220a are formed inside the first mask 220 so as to respectively expose portions of the solder ball lands $P_1$, and openings 225a are formed inside the second mask 225 so as to respectively expose portions of the interconnections C.

Thus, a circuit board is fabricated having solder ball lands $P_1$ and interconnections C on opposite sides of a base substrate 201. The solder ball lands $P_1$ and the interconnections C include a first conductive layer pattern 202 and a second conductive layer pattern 205, which are sequentially stacked on the base substrate 201. The solder ball lands $P_1$ have land holes $h\_1$, $h\_2$, $h\_3$ having different sizes with respect to each other.

As described above, according to the present invention, since the solder ball lands have land holes having different sizes with respect to each other, the solder balls can be disposed on the same plane surface even if warping occurs in the semiconductor package. Therefore, since warping of the semiconductor package is compensated, a mounting operation with other semiconductor packages or mounting substrates can be reliably performed.

According to an aspect of the invention, there is provided a circuit board including a base substrate having interconnections; and solder ball lands disposed on one surface of the base substrate and respectively having land holes having different sizes with respect to each other.

According to another aspect of the invention, there is provided a semiconductor package including a base substrate having interconnections; a semiconductor chip disposed on one surface of the base substrate and being electrically connected to the interconnections; solder ball lands disposed on the other surface of the base substrate and respectively having land holes having different sizes; and solder balls respectively disposed on the solder ball lands.

In the circuit board and the semiconductor package, the land hole disposed at the center portion of the base substrate and the land hole disposed at the edge portion of the base substrate may have different sizes with respect to each other. For example, the sizes of the land holes may increase from the center portion of the base substrate to the edge portion of the base substrate, and on the contrary, the sizes of the land holes may decrease from the center portion of the base substrate to the edge portion of the base substrate.

In the circuit board and the semiconductor package, a mask having openings respectively exposing portions of the solder ball lands may be further disposed on the solder ball lands. At this time, the land holes may be exposed through the openings, and the sizes of the openings may be substantially the same. The land holes may be exposed at the center portions of the openings.

In the circuit board and the semiconductor package, a diameter of the land hole may be increased from a bottom of the solder ball land to a top surface of the solder ball land.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A circuit board comprising:
    a base substrate including two opposite surfaces and including conductive interconnections at a first surface;
    solder ball lands disposed at a second surface of the base substrate and electrically connected to the conductive interconnections, each solder ball land including a land opening, and
    a mask including mask openings corresponding to respective solder ball lands and exposing corresponding portions of the respective solder ball lands, wherein the land openings of the solder ball lands are exposed through the mask openings and the widths of the mask openings are substantially the same with respect to each other,
    wherein the land opening of a first solder ball land disposed at a center portion of the base substrate and another land opening of a second solder ball land disposed at an edge portion of the base substrate have different widths with respect to each other.

2. The circuit board of claim 1, wherein:
    the land opening for the first solder ball land has a different width than the width of its corresponding mask opening, and
    the land opening for the second solder ball land has a different width than the width of its corresponding mask opening.

3. The circuit board of claim 1, wherein the widths of the land openings increase from the center portion of the base substrate to the edge portion of the base substrate.

4. The circuit board of claim 1, wherein the widths of the land openings decrease from the center portion of the base substrate to the edge portion of the base substrate.

5. The circuit board of claim 1, wherein the land openings are exposed by the mask at center portions of the mask openings.

6. The circuit board of claim 1, wherein a diameter of each of the land openings is increased from a bottom of the solder ball land closest to the base substrate to a top surface of the solder ball land furthest from the base substrate.

7. The circuit board of claim 1, wherein solder balls are disposed in the land openings.

* * * * *

UNITED STATES PATENT AND TRADEMARK OFFICE
CERTIFICATE OF CORRECTION

PATENT NO. : 7,952,199 B2  Page 1 of 1
APPLICATION NO. : 12/684476
DATED : May 31, 2011
INVENTOR(S) : Sang-Gui Jo, Seung-Kon Mok and Han-Shin Youn It is certified that error appears in the above-identified patent and that said Letters Patent is hereby corrected as shown below:

Please amend the paragraph beginning at page 1, line 5, as follows:

This application claims the benefit of priority under 35 U.S.C. §120 <u>as a continuation application of</u> [[to]] US Patent Application Serial No. 11/745,342 filed on May 7, 2007, the disclosure of which is incorporated herein by reference in its entirety, and which claims the benefit of priority under 35 U.S.C. §119 to Korean Patent Application No. 10-2006-0041969, filed on May 10, 2006, in the Korean Intellectual Property Office, the disclosure of which is incorporated herein in its entirety by reference.

Signed and Sealed this
Twenty-eighth Day of February, 2012

David J. Kappos
*Director of the United States Patent and Trademark Office*